United States Patent
Lefebvre et al.

(10) Patent No.: US 9,786,803 B2
(45) Date of Patent: Oct. 10, 2017

(54) MULTILAYER POLYVINYLIDENE FILMS STRUCTURES

(75) Inventors: Amy A. Lefebvre, Pottstown, PA (US); Gregory S. O'Brien, Downingtown, PA (US); Samuel Devisme, Rouen (FR); Anthony Bonnet, Saint Laurent de Mure (FR)

(73) Assignee: Arkema Inc., King of Prussia, PA (US)

( * ) Notice: Subject to any disclaimer, the term of this patent is extended or adjusted under 35 U.S.C. 154(b) by 99 days.

(21) Appl. No.: 14/119,016

(22) PCT Filed: Aug. 30, 2012

(86) PCT No.: PCT/US2012/053014
§ 371 (c)(1),
(2), (4) Date: Nov. 20, 2013

(87) PCT Pub. No.: WO2013/033313
PCT Pub. Date: Mar. 7, 2013

(65) Prior Publication Data
US 2014/0158185 A1    Jun. 12, 2014

Related U.S. Application Data

(60) Provisional application No. 61/530,578, filed on Sep. 2, 2011.

(51) Int. Cl.
*H01L 31/044* (2014.01)
*H01L 31/048* (2014.01)
(Continued)

(52) U.S. Cl.
CPC .......... *H01L 31/0487* (2013.01); *B32B 5/022* (2013.01); *B32B 5/024* (2013.01);
(Continued)

(58) Field of Classification Search
CPC ........ Y02E 10/50–10/60; H01L 31/00–31/078
(Continued)

(56) References Cited

U.S. PATENT DOCUMENTS

| 4,988,835 A | 1/1991 | Shah |
| 8,318,316 B2 | 11/2012 | Muckenhuber |

(Continued)

FOREIGN PATENT DOCUMENTS

| WO | WO 2008/138022 | 11/2008 |
| WO | WO2010101811 | * 9/2010 |

*Primary Examiner* — Bach Dinh
(74) *Attorney, Agent, or Firm* — Thomas F. Roland

(57) ABSTRACT

The invention relates to a multi-layer weatherable film structure having an outer layer of a highly weatherable film, a layer having a high thermal deformation temperature, an optional tie layer, and a thin layer of polyolefin or polyamide. The highly weatherable film layer preferably is polyvinylidene fluoride. The polyolefin or polyamide layer is less than 500 microns in thickness, and preferably the whole film structure is less than 750 microns thick. The polyolefin|polyamide side of the film structure can easily be adhered to many different substances—especially polyolefins and polyamides. This film can be used to provide a highly weatherable protective layer a substrate. One useful application for the film is in a photovoltaic module to protect the back side of the module from weathering and abrasion. The multi-layer film structure can be adhered to a typical polyolefin-based encapsulant layer and used as a backsheet encapsulant in a photovoltaic module.

18 Claims, 1 Drawing Sheet

(51) Int. Cl.
*H01L 31/049* (2014.01)
*B32B 5/02* (2006.01)
*B32B 27/08* (2006.01)
*B32B 27/12* (2006.01)
*B32B 27/20* (2006.01)
*B32B 27/30* (2006.01)
*B32B 27/32* (2006.01)
*B32B 27/34* (2006.01)

(52) U.S. Cl.
CPC .............. *B32B 27/08* (2013.01); *B32B 27/12* (2013.01); *B32B 27/20* (2013.01); *B32B 27/304* (2013.01); *B32B 27/32* (2013.01); *B32B 27/34* (2013.01); *H01L 31/049* (2014.12); *B32B 2307/712* (2013.01); *B32B 2457/12* (2013.01); *Y02E 10/50* (2013.01)

(58) Field of Classification Search
USPC .................................................. 136/243–265
See application file for complete search history.

(56) References Cited

U.S. PATENT DOCUMENTS

| | | |
|---|---|---|
| 2006/0280922 A1 | 12/2006 | Hull et al. |
| 2008/0261050 A1* | 10/2008 | Hartzel ................... B32B 27/08 428/421 |
| 2009/0197091 A1 | 8/2009 | Kirk, II et al. |
| 2010/0059105 A1 | 3/2010 | Muckenhuber |
| 2010/0089445 A1* | 4/2010 | Yasukawa ................. B32B 7/12 136/256 |
| 2010/0119841 A1 | 5/2010 | Muckenhuber |
| 2010/0175742 A1 | 7/2010 | Burchill et al. |
| 2010/0258162 A1 | 10/2010 | O'Brien et al. |
| 2010/0300528 A1* | 12/2010 | Fujii ........................ B32B 7/12 136/256 |
| 2011/0048512 A1* | 3/2011 | Chu .......................... B32B 7/12 136/252 |
| 2012/0073632 A1 | 3/2012 | Kosar et al. |

* cited by examiner

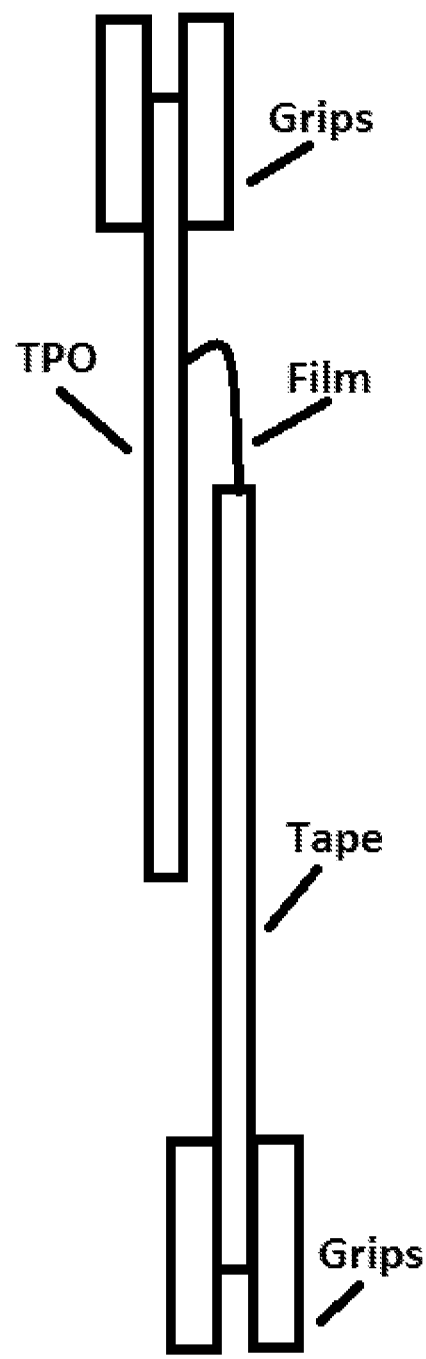

MULTILAYER POLYVINYLIDENE FILMS STRUCTURES

This application claims benefit, under U.S.C. §119 or §365 of PCT Application Number PCT/US2012/053014, filed Aug. 30, 2012, and US Provisional Application No. 61/530,578, filed Sep. 2, 2011.

FIELD OF THE INVENTION

The invention relates to a thin multi-layer weatherable film structure having an outer layer of a highly weatherable film, a layer having a high thermal deformation temperature, an optional tie layer, and a thin layer of polyolefin or polyamide. The highly weatherable film layer preferably is polyvinylidene fluoride. The polyolefin or polyamide layer is less than 500 microns in thickness, and preferably the whole film structure is less than 750 microns thick. The polyolefin/polyamide side of the film structure can easily be adhered to many different substances—especially polyolefins and polyamides. This film can be used to provide a highly weatherable protective layer on a substrate. One useful application for the film is in a photovoltaic module to protect the back side of the module from weathering and abrasion. The multi-layer film structure can be adhered to a typical polyolefin-based encapsulant layer or if the multi-layer film contains a thick polyolefin layer (>200 microns), the multilayer film structure could be both the backsheet and encapsulant layers for the backside of the PV module.

BACKGROUND OF THE INVENTION

Polyvinylidene fluoride (PVDF) is a highly weatherable, chemically resistant engineering plastic. Polyvinylidene film can be difficult to adhere directly to many substrates, such as polyolefins and polyamides without treating the surface of the film with primers or other surface treatments like corona, plasma etc, and/or without the use of adhesives.

Polyvinylidene fluoride has been used in multi-layer fuel hose constructions with polyamides or polyolefins. US 2005-0170,121, and US 2006-0275572 for example. Each of these hose constructions involves thick layers of polymer, bonded with tie layers.

PVDF films have been attached to polyesters, as described in patent applications FR 10.58328, WO 07/085,769, US 2010/0175742 and WO 2011/086318, by using an adhesive. The polyester side of the PVDF/adhesive/polyester constructions is then treated and an adhesive layer added to attach another polyolefin-based film. These PVDF/adhesive/polyester/adhesive/polyolefin constructions are often used as backsheets in a photovoltaic module. Photovoltaic (PV) modules typically consist of a transparent glass or polymer frontsheet, solar cells protected by encapsulation, and a backsheet. The solar cells could be made of crystalline silicon, amorphous silicon, cadmium indium gallium selenide (CIGS), or cadmium indium selenide (CIS), or other similar materials. The backsheet is exposed to the environment on the backside of the module. The primary function of the backsheet is to provide protection to the encapsulated cells from degradation induced by reactions with water, oxygen, and/or UV radiation. The backsheet also provides electrical insulation for the module. Solar cells are commonly encapsulated in ethylene vinyl acetate (EVA), so the backsheet material should adhere well to EVA when the components of the PV are laminated together in a thermoforming process.

The problem with attaching PVDF, and other weatherable films to a polyolefin, as currently practiced in a photovoltaic backsheet is that the costs are high, due to both the expense of the high-performance materials, and the multiple lamination steps in the process. Further, attempting to laminate a very thin (<50, preferably <75 micron) surface treated monolayer PVDF film directly to a polyolefin encapsulant results in wrinkling of the PVDF layer, which can lead to electrical problems in the photovoltaic module.

A thin multi-layer film construction has now been developed, which overcomes the problems described above, having an outer layer of polyvinylidene fluoride or other weatherable polymer, and an inner layer of polyolefin or polyamide. The multi-layer film is capable of adhering to functionalized and non-functionalized polyamide, and/or functionalized and non-functionalized polyolefin substrates, without the need for further surface treatment or coatings/adhesives/tie layers. A substrate having the inventive film adhered thereto, is provided the weathering protection of the polyvinylidene fluoride or other weatherable polymer at a reduced cost. The multi-layer film can be formed in a single unit coextrusion or extrusion coating process.

The purpose of the invention is to provide a multi-layer film with a pre-adhered" polyolefin or polyamide layer on one side and a highly weatherable layer on the other side. This allows for immediate adherence of the film to a polyolefin or polyamide substrate during manufacturing of a structure.

If the polyolefin layer is thick enough, then the multi-layer film structure could be used independently as a backsheet encapsulant in a PV module. A backsheet encapsulant is a single material that serves as both the backsheet and the backside encapsulant layer in a photovoltaic module.

SUMMARY OF THE INVENTION

The invention relates to a multi-layer film structure comprising, in order:
a) a highly weatherable layer;
b) a high thermal deformation temperature layer;
c) an optional tie layer; and
d) a polyolefin or polyamide layer;
where a single polyamide layer could function as both the high thermal deformation temperature layer b), and also the polyamide layer d) without any tie layer c); where each layer is adhered to one another in their respective contact regions, where the total film thickness is greater than 25 microns and less than 750 microns, and where each layer is a thermoplastic.

The invention further relates to a photovoltaic module having the multi-layer film structure as the outermost backsheet layer or backsheet encapsulant.

The invention further relates to the multi-layer film laminated to a polyolefin or polyamide sheet, where the multi-layer film is the outermost layer, that can be made into a thermoformed part.

BRIEF DESCRIPTION OF THE DRAWINGS

FIG. 1 is a diagram of the testing apparatus used in Example 5 to measure adhesion between layers of a multi-layer structure.

DETAILED DESCRIPTION OF THE INVENTION

Unless otherwise stated, all percentages are weight percentages, and all molecular weights are weight average molecular weights. All references cited are incorporated herein by reference.

The invention relates to a multilayer film having the construction of a highly weatherable layer, a high deformation layer, an optional tie layer, and a polyolefin or polyamide layer. Each individual layer may be made of one or more sublayers. All layers of the film are thermoplastic.

Highly Weatherable Layer

The multi-layer film of the invention contains one or more weatherable layers on the outside of the film. By "highly weatherable" as used herein is meant that the material passes the AAMA 2605 standard requiring a least 50% 60-degree gloss retention after 10 years of south Florida exposure at a south-facing 45 degree angle.

Examples of highly weatherable thermoplastic materials for use in the highly weatherable film include, but are not limited to, fluoropolymers, such as polyvinylidene fluoride (PVDF), ethylene tetrafluoroethylene (ETFE), terpolymers of ethylene with tetrafluoroethylene and hexafluoropropylene (EFEP), terpolymers of tetrafluoroethylene-hexafluoropropylene-vinyl fluoride (THV), copolymers of vinyl fluoride, and blends of PVDF with functionalized or unfunctionalized polymethyl methacrylate polymers and copolymers. The fluoropolymers may be functionalized or unfunctionalized, and could be homopolymers or copolymers, and blends thereof. The fluoropolymers could also be a blend with a compatible polymer, such as polymethylmethacrylate, where the fluoropolymer comprises more than 50 weight percent of the blend, and preferably more than 75 weight percent.

The weatherable layer has a thickness of from greater than 1 microns to 125 microns, preferably from 3 to 75 microns, and most preferably from 3 to 50 microns. In one embodiment, a weatherable layer of 25 microns or greater can serve as both the weatherable layer and the high deformation temperature layer.

High Deformation Temperature Layer

The high thermal deformation layer provides structural support for the multi-layer film. By "high thermal deformation layer" as used herein is meant a thin layer of between 25 microns and 250 microns, and preferably between 50 and 125 microns, having a thermal deformation temperature greater than that used in a downstream manufacturing process involving the multi-layer film. Preferably the thermal deformation temperature is at least 10° C. and more preferably at least 15° C. above any manufacturing temperature. The thermal deformation temperature can be measured by differential scanning calorimetry (DSC) or dynamic mechanical analysis (DMA). For glassy polymers, the deformation temperature could be the glass transition temperature (Tg) of the material. For crystalline polymers the deformation temperature could be the highest melting point (Tm) in an alloy or graft copolymer. For testing by DMA the deformation temperature could be defined by a modulus as measured by DMA. For example, for a process where the highest downstream manufacturing temperature is 150° C., the DMA of the high thermal deformation layer could be greater than 75 MPa at 150° C., as measured by the DMA storage modulus.

Examples of materials useful in the high deformation temperature layer include, but are not limited to PVDF, THV, ETFE, EFEP, polyamide 6 (PA6), PA 6,6, PA 11, PA 12, PA 10.10, PA 6.10, PA 6.12, polyamide alloys—such as ORGALLOY products (from Arkema Inc.)

In one embodiment a single material could serve as both the weatherable layer and the high thermal deformation layer. In this case, the single material has a thickness of at least 25 microns, and a preferred range of 50-125 microns. Materials that can serve as both the weatherable layer and high thermal deformation layer include, but are not limited to PVDF, ECTFE, ETFE, EFEP, and PVDF/PMMA blends.

In a preferred embodiment, the multi-layer film structure will contain one or more polyvinylidene fluoride (PVDF) or PVDF copolymer film layers as either the weatherable layer, high thermal decomposition layer, or both (as a single material or as two or more different PVDF layers). The PVDF layer(s) provides weathering protection, high dielectric strength, chemical resistance, and abrasion resistance. The PVDF layer should also have good adhesion to the adjoining layer, and to the polyolefin or polyamide layer directly or through a tie layer. The PVDF adhesion can be enhanced by surface treatment (plasma/corona etc).

Each PVDF layer composition of the invention may be a homopolymer, a copolymer, a terpolymer or a blend of a PVDF homopolymer or copolymer with one or more other polymers that are compatible with the PVDF (co)polymer. PVDF copolymers and terpolymers of the invention are those in which vinylidene fluoride units comprise greater than 70 percent of the total weight of all the monomer units in the polymer, and more preferably, comprise greater than 75 percent of the total weight of the units. Copolymers, terpolymers and higher polymers of vinylidene fluoride may be made by reacting vinylidene fluoride with one or more monomers from the group consisting of vinyl fluoride, trifluoroethene, tetrafluoroethene, one or more of partly or fully fluorinated alpha-olefins such as 3,3,3-trifluoro-1-propene, 1,2,3,3,3-pentafluoropropene, 3,3,3,4,4-pentafluoro-1-butene, and hexafluoropropene, the partly fluorinated olefin hexafluoroisobutylene, perfluorinated vinyl ethers, such as perfluoromethyl vinyl ether, perfluoroethyl vinyl ether, perfluoro-n-propyl vinyl ether, and perfluoro-2-propoxypropyl vinyl ether, fluorinated dioxoles, such as perfluoro(1,3-dioxole) and perfluoro(2,2-dimethyl-1,3-dioxole), allylic, partly fluorinated allylic, or fluorinated allylic monomers, such as 2-hydroxyethyl allyl ether or 3-allyloxypropanediol, and ethene or propene. Preferred copolymers or terpolymers are formed with vinyl fluoride, trifluoroethene, tetrafluoroethene (TFE), and hexafluoropropene (HFP).

Especially preferred copolymers contain VDF comprising from about 71 to about 99 weight percent VDF, and correspondingly from about 1 to 29 percent HFP percent VDF, and correspondingly from about 1 to about 29 percent TFE; from (such as disclosed in U.S. Pat. No. 3,178,399); and from about 71 to 99 weight percent VDF, and correspondingly from about 1 to 29 weight percent trifluoroethylene.

Especially preferred thermoplastic terpolymers are the terpolymer of VDF, HFP and TFE, and the terpolymer of VDF, trifluoroethene, and TFE. The especially preferred terpolymers have at least 71 weight percent VDF, and the other comonomers may be present in varying portions, but together they comprise up to 29 weight percent of the terpolymer.

The PVDF layer(s) could also be a blend of a PVDF polymer with a compatible polymer, such as polymethyl methacrylate (PMMA) and PMMA copolymers containing up to 35 wt % of $C_{1-4}$ alkyl acrylate co-monomers, where the PVDF makes up greater than 30 weight percent, and preferably greater than 60 weight percent. PVDF and PMMA can be melt blended to form a homogeneous blend. A preferred embodiment is a blend of 60-80 weight percent of PVDF and 20-40 weight percent of polymethyl methacrylate of a polymethylmethacrylate copolymer.

The PVDF layer could be a single layer, or could consist of more than one PVDF layer. In some cases, a PVDF layer may also serve as a tie layer, or part of a multiple tie-layer construction.

The PVDF film layer composition, in addition to PVDF may contain other additives, such as, but not limited to impact modifiers, UV stabilizers, plasticizers, fillers, coloring agents, pigments (such as $TiO_2$), antioxidants, antistatic agents, surfactants, toner, matting agents, adhesion promoters, and dispersing aids. In a one embodiment, a pigment is added to aid in reflectance of light. In another embodiment, UV adsorbers are preferably present at levels of from 0.05 percent to 5.0 percent in the PVDF. Also pigments can be employed at levels from 2.0 percent to 30 percent by weight, based on the polymer. In one embodiment, a weatherable fluoropolymer layer is made up of 51 to 100 weight percent fluoropolymer; 0 to 49 weight percent of a compatible resin, for example a (meth)acrylic polymer or copolymer; 0-30 weight percent of a mineral filler or pigment; and 0 to 7 weight percent of other additives.

The PMMA that may be in the highly weatherable layer or high thermal deformation layer can be a homopolymer or copolymer and functionalized or non-functionalized. By "copolymer" as used herein means a polymer having two or more different monomer units. The copolymer could be a terpolymer with three or more different monomer units, or have four or more different monomer units. The copolymer may be a random copolymer, a gradient copolymer, or a block copolymer formed by a controlled polymerization process. The copolymer could also be a graft copolymer, or have a controlled structure such as a star or comb. Preferably, the copolymer is formed by a free radical polymerization process or an anionic polymerization process, and the process can be any polymerization method known in the art, including but not limited to emulsion, solution, suspension polymerization, and can be done in bulk, and semi-bulk.

The PMMA copolymer preferably contains at least 50 weight percent of methyl methacrylate monomer units, preferably at least 70 weight percent and more preferably at least 85 weight percent methylmethacrylate monomer units. The acrylic copolymers contain from 0.01 to 50, preferably 3 to 25, and more preferably 4 to 15 weight percent of at least one co-monomer. Useful monomers that can impart a higher Tg to a copolymer include, but are not limited to, methacrylic acid, acrylic acid, itaconic acid, substituted styrenes, alpha methyl styrene, maleic anhydride, isobornyl methacrylate, norbornyl methacrylate, t-butyl methacrylate, cyclohexyl methacrylate, phenyl methacrylate, acrylamide, N-isopropylacrylamide, methacrylamide, substituted maleimides, glutarimide, and maleimide.

The methyl methacrylate copolymer may additionally contain one or more other vinyl monomers copolymerizable with methyl methacrylate, including but not limited to other acrylate and methacrylate monomers or other ethylenically unsaturated monomers, including but not limited to, styrene, alpha methyl styrene, and acrylonitrile. Other methacrylate and acrylate monomers useful in the monomer mixture include, but are not limited to, methyl acrylate, ethyl acrylate and ethyl methacrylate, butyl acrylate, iso-octyl methacrylate and acrylate, lauryl acrylate and lauryl methacrylate, stearyl acrylate and stearyl methacrylate, isobornyl acrylate and methacrylate, methoxy ethyl acrylate and methacrylate, 2-ethoxy ethyl acrylate and methacrylate, dimethylamino ethyl acrylate and methacrylate monomers.

In one embodiment, the PMMA is a copolymer containing at least 0.01 weight percent, and preferably from 1 to 25 weight percent, more preferably 2 to 20 weight percent of polar functionalized monomer units. The functionalization can result from the copolymerization of one or more functionalized monomers, the grafting of one or more functionalized monomers, or the post-polymerization functionalization of the acrylic polymer. The functionalization may exist as functionalized blocks in a block copolymer. Useful functionalized monomers include, but are not limited to those containing acid, anhydride, hydroxy, epoxy, and amine groups.

In one embodiment, especially useful in photovoltaic module backsheets, at least one of the weatherable layer and/or high thermal deformation layers should include additives and/or pigment to make the multi-layer film opaque to UV light. Most preferably the additives and/or pigment are present in the weatherable layer. By opaque to UV light is meant that the film has an absorbance of greater than 1 at 360 nm, and preferably an absorbance of greater than 2 at 360 nm.

In one embodiment, the fluoropolymer is functionalized, or contains functional groups that are grafted or copolymerized onto or into the backbone of the polymer. The functionalized PVDF could also be a blend with a (preferably compatible) functional resin or co-functional co-resin (such as a functional acrylic type resin). The functionalization can help improve adhesion of the fluoropolymer layer to the adjoining layer. The functional fluoropolymer could be a functionalized polyvinylidene fluoride polymer, such as for example a maleic anhydride functional PVDF (including KYNAR ADX from Arkema). The functionalized fluoropolymer could also be a functional ETFE or EFEP, as known in the art.

If the multi-layer film will be combined with a substrate, such as an encapsulant material or a thermoplastic sheet, using an extrusion coating process or a heat lamination process, the entire film structure needs to have a thermal resistance high enough that there is not appreciable deformation or melting during the process (with the exception of the polyamide or polyolefin layer). If the thermal resistance is too low, the film could soften and wrinkle during the downstream process, especially the layers in contact with moving parts.

The high thermal deformation layer must adhere to the polyolefin or polyamide layer that makes up the outermost layer of the film on the opposite side from the weatherable layer (unless the high thermal deformation layer and polyamide layer are one-in-the-same). The adhesion can be accomplished by several different means. In one embodiment, the high heat deformation layer is a functionalized polymer, or blend including a functionalized polymer, which can be directly adhered to a functionalized polyolefin or polyamide. In another embodiment, the high heat deformation layer is a polyvinylidene fluoride that is surface treated by methods known in the art, including but not limited to corona treatment, flame treatment, plasma treatment, electron beam treatment, and oxidation treatment.

Tie Layers

Since the polyvinylidene fluoride layer has at best a weak adhesion to a polyolefin or polyamide layer, one or more tie layers may be employed to increase the adhesion, unless the PVDF is functionalized or the PVDF is surface treated. The tie layer(s) have a functionality that enable good adhesion between the tie layer and the layers on either side of the tie layer.

Useful tie layers of the invention include, but are not limited to: a PVDF blended with a compatible polymer having some functionality—such as a PVDF/(meth)acrylic (copolymer blend having acid functionality; a functionalized PVDF—such as a maleic anhydride-grafted PVDF; functional polyolefin—including maleic anhydride or epoxy-functional polyolefins (such as LOTADER copolymer and OREVAC grafted resins from Arkema), and blends of functional olefins with non-functional olefins; blends of PVDF with anhydride containing PMMA; and polyester thermoplastic polyurethanes.

Polyolefin (PO), Polyamide (PA) Layer

The multi-layer film structure of the invention contains on one side a layer of a polyolefin or polyamide. The polyolefin or polyamide could be functionalized or non-functionalized—or a blend thereof. Useful polyolefins include polyolefins, polyolefin copolymers and alloys thereof. Polyolefins useful in the invention include, but are not limited to ethylene, propylene, 1-butene, 1-hexene, 1-octene or 1-decene, and mixtures thereof.

In one embodiment, the polyolefin is a copolymer of one or more olefins and one or more alkyl(meth)acrylates. Examples of olefin/alkyl(meth)acrylates useful in the present invention include copolymers of ethylene with butyl acrylate, methyl acrylate or ethylhexyl acrylate, such as LOTRYL resins from Arkema Inc.

Functional polyolefins are preferred, and include, but are not be limited to terpolymers of ethylene/butyl acrylate/maleic anhydride, ethylene/methyl acrylate/maleic anhydride, ethylene/ethyl acrylate/maleic anhydride, and ethylene/methyl acrylate/glycidyl methacrylate—such as LOTADER resins from Arkema; OREVAC grafted polyolefins from Arkema; ethylene vinyl acetate, polyamide grafted functional polyolefins (APOLHYA from Arkema); an amine terminated polyamide.

Polyamides useful in the invention include both polyamides and copolyamides, Polyamides with melting points below 235° C. are preferred for ease of co-extrusion and processing. Useful polyamides include, but are not limited to, PA6, PA66, PAH, PA12, PA610, PA 612, PA 614, PA 69, blends and alloys thereof, and blends of polyamides with functional and non-functional polyolefins, and blends with impact modified polyamides. In a preferred embodiment, the polyamide is RILSAN BESN TL (PA11) or RILSAN BESN TL (PA12) from Arkema Inc., or ORGALLOY R60ES, ORGALLOY LE60THM or ORGALLOY LE600 from Arkema.

The polyolefin layer will be less than 500 micron in thickness, preferably less than 450 microns thick, and most preferably between 5 and 400 microns in thickness. The polyamide layer will be less than 250 microns, and preferably from 5 to 125 microns in thickness. The polyolefin or polyamide layer could contain one or more fillers, such as pigments (for example $TiO_2$, ZnO), anti-oxidants, short aspect ratio glass fibers, UV absorbers, or hollow sphere polymers serving as both a white pigment and add to the insulation value of the layer.

In one embodiment a woven or non-woven mesh or scrim is placed on or within the polyolefin layer. Scrims useful in the invention are made of, but not limited to, glass fibers and polyester fibers. The benefit of this structure is that even with a high melt flow polyolefin layer—the scrim can maintain a minimum layer thickness to enhance the dielectric performance, especially when the polyolefin layer is greater than 200 microns, such as in a backsheet encapsulant. In addition, the scrim can also improve the cut through resistance of the backsheet encapsulants.

Film Formation

The films of the invention can be formed by known means for multi-layer film formation. In one embodiment, all layers are coextruded to form the multi-layer film. In another embodiment, the polyolefin layer could be extrusion coated onto the film, which is especially useful with a thicker polyolefin film. Another option is to apply primer to the film via spray or another coating process, then extrusion coat the polyolefin layer. Another option is to surface treat the film, then extrusion coat the polyolefin layer. Preferably all other layers of the film are coextruded together prior to any extrusion coating of the polyolefin layer, The total thickness of the multi-layer film is less than 750 microns. In one embodiment, a thin film or less than 250 microns, and preferably less than 200 microns is produced. In the case of a backsheet encapsulant structure, the total thickness is greater than 250 microns, preferably greater than 525 microns, and more preferably more than 600 microns.

Film Uses

The multi-layer films of the invention provide a means for adhering a PVDF, or other weatherable protective layer to many substrates to which the PVDF alone has poor adhesion. These include, but are not limited to polyolefins, and polyamides.

Preferably, the film structure needs no further surface treatment, coating or adhesive in order to adhere to the encapsulant during the lamination process. In one embodiment, the multi-layer film of the invention could be used in a photovoltaic back sheet, and in a case of a thicker backsheet encapsulant the multi-layer film could be the entire backsheet and back-side encapsulant. The polyolefin or polyamide side of the film could be directly adhered to a polyolefin encapsulant material used to encapsulate and protect the fragile solar cells. The polyolefin encapsulant may be a functionalized or non-functionalized polyolefin, and may be a thermoplastic or thermoset material. In one embodiment, the encapsulant material can be directly applied as an additional layer to the film structure on the side of the polyolefin or polyamide to form a backsheet encapsulant composite. This composite can then be inserted, as a single unit into the lamination process by which a final photovoltaic module is made.

In another embodiment, the film structure itself could be used in a photovoltaic module as both the backsheet and back encapsulant layer in the module.

In another embodiment, the multi-layer film of the invention could be laminated onto a polyolefin or polyamide sheet, and the laminate then thermoformed into an article. This process could be used to produce parts for end-use applications such as automotive, lawn and garden equipment, recreational vehicles, agricultural equipment, and anywhere that large painted or pigmented parts are used.

Examples of useful film constructions of the invention include, but are not limited to the following. The polyolefin used in the examples below is a low density polyethylene (LDPE). Additives=UV absorbers and hindered amine light stabilizers, thermal stabilizers, and/or pigments like TiO2 are included to protect underlying layers and encapsulant. "f-_" is used below to indicate "functionalized".

1. PVDF/PVDF-acrylic blend+additives/maleic anhydride functionalized PVDF/glycidal methacrylate functionalized polyolefin/polyolefin.
2. PVDF/PVDF-acrylic blend+additives/maleic anhydride functionalized PVDF/glycidal methacrylate functionalized polyolefin.
3. PVDF/PVDF-acrylic blend+additives/functionalized polyolefin/polyolefin: acrylic may or may not be functionalized to facilitate adhesion with functionalized polyolefin.
4. PVDF/PVDF-acrylic blend+additives/functionalized polyolefin: acrylic may or may not be functionalized to facilitate adhesion with functionalized polyolefin.
5. PVDF/PVDF-acrylic blend+additives/PVDF-acrylic blend/functionalized polyolefin/optional polyolefin:

acrylics may or may not be functionalized to facilitate adhesion with functionalized polyolefin.

6. PVDF/PVDF-acrylic blend+additives/KYNAR ASP 720/ polyamide 11, 12, 6, 6.6, 6.6-6, etc., PA alloy such as ORGALLOY/OREVAC 18360 (MAH functional polyolefin).
7. PVDF/PVDF-acrylic blend+additives/KYNAR ASP 720/ polyamide/polyamide grafted polyolefin (APOLHYA).
8. MAH functionalized PVDF+additives/polyamide having amine termination.
9. PVDF+additives (w or w/o PMMA)/KYNAR ASP 720/ Polyamide (s) (amine terminated or other)/optional PE layer (KYNAR ASP 720 is a blend of anhydride functional PMMA and PVDF that is impact modified).
10. PVDF+PMMA-anhydride/optional tie layer/Polyamide/ optional polyolefin layer (functional polyolefin or functional grafted polyolefin or non functionalized polyolefin).
11. PVDF+additives/MAH functionalized PVDF with or without other additives/amine terminated polyamide/optional functionalized polyolefin layer.
12. PVDF/PVDF-acrylic blend layers in items 1-11 could be replaced by a single PVDF layer containing additives like $TiO_2$+ZnO with or without functionalized or unfunctionalized acrylic.
13. A PVDF layer can be a monolayer with pigment:
    a. PVDF+f-PMMA+$TiO_2$ (etc)/functionalized polyolefin (eg GMA type)/optional PO/FPO where layer PVDF contributes all the thermal resistance
    b. PVDF+ZnO (+$TiO_2$ etc)/KYNAR ASP 720 tie layer/ PA/FPO
    c. PVDF+PMMA+pigment etc/KYNAR ASP 720/PA/ FPO/Optional PO
    d. f-PVDF+pigment+(optional PMMA and/or PVDF)/ FPO/PO where the PVDF layer provide all the thermal resistance.
14. A high thermal deformation layer with proper selection of tie-layer technology to combine with PVDF and PO or FPO.
13. Functional ETFE/PA/optional functional PO.

EXAMPLE 1-3

Multilayer films containing a polyvinylidene fluoride outer layer, a polyamide based higher thermal deformation layer, and a polyolefin or polyamide layer (either a different polyamide from the high thermal deformation layer, or else a single polyamide layer is both the high thermal deformation layer and polyamide layer) were coextruded on a blown film line equipped with a pancake die at a die temperature of 240° C. The exact film structures are listed in Table 1. The polyvinylidene fluoride (PVDF)/polymethylmethacrylate (PMMA)/$TiO_2$ blend used in Layer 2 of the multilayer films was precompounded using a twin screw extruder prior to coextruding the multilayer film. The exact composition of this layer is listed in Table 1. For multilayer films 1 and 2, the high thermal deformation layer is also the polyamide layer. The film layer thickness ratio listed in Table 1 was given by the INOEX automatic gravimetric dosing unit equipped on each extruder of the blown film line. Also the interlayer peel strength between layers 3 and 4 at the time of film production and 15 days later is listed in Table 1. The method used to measure the peel strength was in accordance with ISO 11339:1993.

KYNAR 740 is a PVDF homopolymer from Arkema Inc.
KYNAR ASP 720 is an impact modified PVDF/anhydride functionalized acrylic blend from Arkema Inc.
ORGALLOY R60ES and ORGALLOY LE6000 are polyamide/polyolefin alloys from Arkema Inc.
OREVAC 18360 is a maleic anhydride grafted LLDPE polymer from Arkema Inc.

TABLE 1

| Mulitlayer Film | Layer 1 | Layer 1 Thickness (microns) | Layer 2 | Layer 2 Thickness (microns) | Layer 3 | Layer 3 Thickness (microns) | Layer 4 | Layer 4 Thickness (microns) | Layer 5 | Layer 5 Thickness (microns) | Peel Strength at time = 0 (N/15 mm) | Peel Strength at time = 15 days (N/15 mm) |
|---|---|---|---|---|---|---|---|---|---|---|---|---|
| 1 | KYNAR 740 | 5 | 60 wt % PVDF/24 wt % PMMA/16 wt % $TiO_2$ | 20 | KYNAR ASP720 | 10 | ORGALLOY R60ES | 25 | — | — | 5.9 | 7.0 |
| 2 | KYNAR 740 | 5 | 60 wt % PVDF/24 wt % PMMA/16 wt % $TiO_2$ | 20 | KYNAR ASP 720 | 10 | ORGALLOY LE6000 | 25 | — | — | 3.4 | 3.75 |
| 3 | KYNAR 740 | 5 | 60 wt % PVDF/24 wt % PMMA/16 wt % $TiO_2$ | 20 | KYNAR ASP720 | 10 | ORGALLOY R60ES | 25 | OREVAC 18360 | 20 | 5.7 | 6.1 |

Test coupons were made by laminating together the multilayer film, an encapsulant layer, and a HEMERA GPE 500 backsheet from CPP Solar, where layer 4 or 5 of the multilayer film was in contact with one side the encapsulant and E layer of the backsheet was in contact with the other side of the encapsulant. The encapsulants tested were either a polyolefinic thermoplastic encapsulant (BEMIS 6370 from Bemis Associates), a polyamide-g-polyproplyene encapsulant (APOLHYA® R333D from Arkema), or an ethylene vinyl acetate copolymer based encapsulant (STR 15420 from STR). Laminations were performed on a P-Energy laminator model L036A using the following cycle:

Step 1—20 minutes under vacuum while ramping from 80° C. to 135° C.

Step 2—Ramp to 145° C. under one atmosphere of pressure

Step 3—Hold 145° C. for 10 minutes under one atmosphere of pressure

Step 4—Cool to approximately 80° C. while under one atmosphere of pressure

Step 5—Remove sample

The laminator temperatures listed are set temperatures. Once laminated the test coupons were allowed to condition at 23° C., 50% relative humidity for at least 24 hours prior to conducting a T-peel test according to ASTM D1876-08. The T-peel test was used to measure the adhesion level between the multilayer film and the encapsulant. Test coupons were also placed into a Thermotron SE-1000-5-5 environmental chamber and exposed to 85° C./85% relative humidity conditions. After 500 and 1000 hours of exposure, coupons were removed from the chamber, allowed to condition at 23° C., 50% relative humidity for at least 24 hours prior to conducting a T-peel test according to ASTM D1876-08. The peel strength between the multilayer film and the encapsulants at time=0, 500, and 1000 hrs of exposure to 85° C./85% relative humidity conditions are reported in Table 2.

TABLE 2

| | | Peel Strength (N/15 mm) After Damp Heat Exposure (85° C./85% RH) | | |
|---|---|---|---|---|
| Film | Encapsulant | 0 Hr | 500 Hr | 1000 Hr |
| 1 | APOLHYA R333D | 5.1 | 6.0 | 6.8 |
|   | BEMIS 6370 | 6.6 | Film broke | Film broke |
|   | STR 15420 EVA | Film broke | Film broke | Film broke |
| 2 | APOLHYA R333D | 9.8 | 8.9 | 33.8 |
|   | BEMIS 6370 | 8.0 | Film broke | Film broke |
|   | STR 15420 EVA | Film broke | Film broke | Film broke |
| 3 | APOLHYA R333D | Film broke | Film broke | Film broke |
|   | BEMIS 6370 | Film broke | Film broke | Film broke |
|   | STR 15420 EVA | Film broke | Film broke | NA |

Excellent adhesion was obtained between the multilayer films and the encapsulants tested. In most cases, the multilayer film broke during the peel testing indicating the adhesion strength was greater than the tensile strength of the film.

It is expected that after 5000 hours of exposure in a QUV A accelerated weatherometer using ASTM G154 cycle 6 with an irradiance of 1.55 at 340 nm for the exposure cycle, these films would have >80% gloss retention, indicating good weathering performance.

EXAMPLE 4 (Comparative)

A 4 mil thick monolayer polyvinylidene fluoride film was extruded on a cast film line at a die temperature of 220° C. Film thickness was measured with a hand held micrometer.

Test coupons were made by laminating together the monolayer polyvinylidene fluoride film, an encapsulant layer, and a HEMARA GPE 500 backsheet from CPP Solar, the monolayer film was in contact with one side the encapsulant and E layer of the backsheet was in contact with the other side of the encapsulant. The encapsulants tested were either a polyolefinic thermoplastic encapsulant (BEMIS 6370 from Bemis Associates), or a polyamide-g-polyproplyene encapsulant (APOLHYA® R333D from Arkema). Laminations were performed on a P-Energy laminator model L036A using the following cycle:

Step 1—20 minutes under vacuum while ramping from 80° C. to 135° C.

Step 2—Ramp to 145° C. under one atmosphere of pressure

Step 3—Hold 145° C. for 10 minutes under one atmosphere of pressure

Step 4—Cool to approximately 80° C. while under one atmosphere of pressure

Step 5—Remove sample

The laminator temperatures listed are set temperatures. Once laminated the test coupons were allowed to condition at 23° C., 50% relative humidity for at least 24 hours prior to conducting a T-peel test according to ASTM D1876-08. The T-peel test was used to measure the adhesion level between the PVDF film and the encapsulant. The peel strength measured between the PVDF film and the polyolefinic thermoplastic encapsulant was 0.9 N/15 mm, and between the PVDF film and the polyamide-g-polyproplyene encapsulant was 2.1 N/15 mm. Demonstrating the PVDF film does not have high adhesion strength to these materials.

EXAMPLE 5

A 90 mil thick sheet of thermoplastic polyolefin, METAFORM 7200 from Mytex Polymers, was extruded on a Davis 1" extruder at a melt temperature of 465° F. and conveyed through a calendaring vertical roll stack with the roll temperatures were set at 185° F. (top roll), 210° F. (middle roll), and 215° F. (bottom roll). Film 3, listed in the table above, was laminated to the polyolefin sheet by drawing the film into the calendaring roll stack between the top and middle rolls at the same time the sheet was being calendared. During lamination the multilayer film was oriented such that the OREVAC 18360 layer was in contact with the polyolefin sheet to achieve good adhesion. Once laminated the sheet was allowed to condition at 23° C., 50% relative humidity for at least 24 hours prior to conducting a peel test. A sample of the laminate was cut into 1 inch strips and tested on the Instron 4201 at 2 inches per minute using a 100 pound load cell. The test was setup according to the FIGURE below, a variation of ASTM D 1876, with the thermoplastic polyolefin sheet oriented vertically in the upper grip. Using a piece of 3M 8979 tape the multilayer film was extended 180° to the bottom grip. Excellent adhesion was obtained between the multilayer film and the polyolefin sheet, as the measured adhesion strength between the film and the polyolefin sheet was 6.542 lbf/in.

It is expected that after 5000 hours of exposure in a QUV A accelerated weatherometer using ASTM G154 cycle 6 with an irradiance of 1.55 at 340 nm for the exposure cycle, these films the laminated sheet would have >80% gloss retention, indicating good weathering performance.

EXAMPLE 6 (Comparative)

A 90 mil thick sheet of thermoplastic polyolefin, METAFORM 7200 from Mytex Polymers, was extruded on a Davis 1" extruder at a melt temperature of 465° F. and conveyed through a calendaring vertical roll stack with the roll temperatures were set at 185° F. (top roll), 210° F. (middle roll), and 215° F. (bottom roll). Film 3, listed in the table above, was laminated to the polyolefin sheet by drawing the film into the calendaring roll stack between the top and middle rolls at the same time the sheet was being calendared. During lamination the multilayer film was oriented such that the KYNAR 740 layer was in contact with the polyolefin sheet. In this case, there was no measurable adhesion between the multilayer film and the polyolefin sheet as the film could be easily peeled off the sheet.

EXAMPLES 7 and 8

Film from Examples 2 and 3 are extrusion coated with APOHLYA LC3-UV (this is a functional polyolefin copolymer using MAH as a comonomer that is reactive extrusion grafted with amine terminated polyamide blocks such that a spontaneous co-continuous structure forms of polyamide and polyolefin from Arkema) The polyamide and functional polyolefins utilized can be adjusted to modify upper melting point (using the polyamide segment) and viscosity (using the polyolefin segment). This particular grade from Arkema has an upper melting point of 132° C. Other grades could be utilized that have melting points up to 216° C. depending on the application. The LC3-UV is extrusion coated onto the polyamide side of the film (for film Ex. 2), and OREVAC side of the film (for film Ex. 3) using a standard extrusion coating line at melt temperatures of 170° C. to 180° C. to deposit a APOLHYA LC3-UV polyolefin layer that is 400 microns (but this could be as low as 200 microns). This layer directly adheres to the multi-layer film. This backsheet encapsulant (BSE) is then laminated into a photovoltaic (PV) module without a layer of cross-linkable EVA behind the cells. The structure used is as follows: Glass/EVA-STR 15420/crystalline Si PVcells/backsheet encapsulant. The lamination conditions are those from the earlier examples. Adhesion is excellent between the backsheet encapsulant and both the cells and the EVA encapsulant and the dielectric performance of the backsheet is delivered by the combination of the multi-layer film and the extruded APOLHYA layer.

EXAMPLE 9

A formulation is produced using PV3345 which is EVA-TANE resin (Arkema), an ethylene vinyl acetate copolymer containing 33% vinyl acetate. LUPEROX TBEC (organic peroxide from Arkema) is added to pellets at a level of 1.5% by weight and tumbled for 30 min. This formulation is then extruded coated onto the film of Example 3 noted above using standard extrusion coating equipment at a melt temperature of about 100° C. to 110° C. to produce a coating thickness of 400 microns. This backsheet encapsulant is laminated into a PV module. The layup would be a stack of glass, a layer of STR 15420 EVA encapsulant sheet, crystalline Si PV cells, and the backsheet encapsulant. The adhesion of the EVA layer to the multi-layer film is excellent. The laminated PV module under standard laminating conditions noted above shows excellent adhesion to both the cells and the top EVA layer and demonstrates good electrical performance.

EXAMPLE 10

The same process and samples were used as in Example 9 but with one difference. There was a non-woven scrim of polyester or glass used as follows in the location as follows: Glass/EVA sheet STR 15420/crystalline Si PV cells/CRANEGLAS 230 6.1 non-woven scrim (Crane and Co.)/backsheet encapsulant. The lamination conditions were as noted in examples 1-4 above. The adhesion of the BSE to the back of the cells and the first layer of EVA was excellent. The scrim helps to set maintain a minimum insulation thickness for the EVA layer on the backside of the cells.

EXAMPLE 11

The same materials were used as noted in example 10. In this example both the film of example 3 and the non-woven scrim (For this example CRANEGLAS 230 6.1) were brought together at the extrusion coating head with the OREVAC 18360 side of the film facing the scrim. The EVA formulation of Example 9 was extruded onto the CRANE-GLAS scrim side of the CRANEGLAS+multi-layer film combined web by standard extrusion coating technology. The full composite of EVA/scrim/multi-layer film are then passed into a nip roll that has a gap (The gap spacing is the total thickness of the EVA/scrim/multi-layer film composite minus 1.2 to 2× the thickness of the scrim layer). This compression forces the EVA fully through the scrim and onto the film surface where it bonds to the olefin film surface. The backsheet encapsulant produced is laminated into the same structure as noted in Example 9. The unique benefit of this structure is that even with a high melt flow polyolefin layer—the scrim can maintain a minimum layer thickness to enhance the dielectric performance of this backsheet encapsulant. The adhesion to the cells, and upper EVA layers in the module are excellent. The electrical performance of the module is also excellent.

What is claimed is:

1. A photovoltaic module comprising a multi-layer film, wherein said multilayer film is directly attached on the back side of the photovoltaic module, and wherein said multi-layer film comprises, in order from the outside of the multi-layer film to the inside:
    a) a highly weatherable layer exposed to the environment; wherein said highly weatherable layer comprises functionalized or non-functionalized polyvinylidene fluoride (PVDF), ethylene tetrafluoroethylene (ETFE), terpolymers of ethylene with tetrafluoroethvlene and hexafluoropropylene (EFEP), terpolymers of tetrafluoroethylene-hexafluoropropylene-vinyl fluoride (THY), vinyl fluoride copolymers that can be melt processed,
    b) a high deformation temperature layer selected from the group consisting of polyvinylidene fluoride (PVDF) hoxnopolymers, copolymers and blends; PVDF blends with polymethyl methacrylate (PMMA); tetrafluoroethylene-hexafluoropropylene-vinylidene fluoride (THV); ethylene tetrafluoroethylene (ETFE); a terpolymer of ethylene, tetrafluoroethylene, and hexafluoropropylene (EFEP); polyamides; and polyamide alloys;
    c) an optional tie layer; and
    d) a polyolefin or polyamide layer selected from the group consisting of polyethylene, polyethylene copolymers with one or more alkyl(meth) acrylates, functional polyethylenes, grafted polyethylene, ethylene vinyl acetate, polyamides, copolyamides and blends and alloys thereof;
    wherein each layer a), b), optional c) and d) is directly adhered to one another in their respective contact regions;
    wherein the total film thickness is greater than 12 microns and less than 750 microns, and wherein each layer is thermoplastic.

2. The multi-layer film structure of claim 1, wherein said highly weatherable layer comprises one or more polyvinylidene fluoride sublayers, wherein said high deformation layer comprises one or more sublayers, wherein said optional tie layer comprises one or more tie sublayers, and wherein said polyamide or polyolefin layer comprises one or more polyolefin or polyamide sublayers.

3. The multi-layer film structure of claim 1, wherein said polyvinylidene fluoride highly weatherable layer comprises a polyvinylidene fluoride homo-, co- or ter-polymer comprising from 70 to 100 weight percent of vinylidene fluoride units.

4. The multi-layer film structure of claim 1, wherein said highly weatherable layer and said high deformation temperature layer exist as a single layer that is at least 25 microns thick.

5. The multi-layer film structure of claim 1, wherein said polyvinylidene fluoride blend high deformation temperature layer comprises a blend of 60 to 80 weight percent polyvinylidene fluoride with 20 to 40 weight percent polymethyl methacrylate.

6. The multi-layer film structure of claim 1, wherein said highly weatherable layer has a thickness of from 1 to 125 microns.

7. The multi-layer film structure of claim 1, wherein said high thermal deformation layer has a thickness of from 25 to 250 microns.

8. The multi-layer film structure of claim 1, wherein said high thermal deformation layer has a thickness of from 50 to 125 microns.

9. The multi-layer film structure of claim 1, wherein said tie layer comprises selected from the group consisting of a PVDF blended with a compatible polymer having some functionality; a functionalized PVDF; functional polyolefin, and blends of functional olefins with non-functional olefins; blends of PVDF with anhydride containing PMMA; blends of PVDF with acid-containing PMMA; and polyester thermoplastic polyurethanes.

10. The multi-layer film structure of claim 1, wherein said polyolefin comprises a non-functional polyethylene ethylene copolymers with one or more alkyl(meth) acrylates.

11. The multi-layer film structure of claim 1, wherein said polyolefin is a functional polyolefin selected from the group consisting of terpolymers of ethylene/butyl acrylate/maleic anhydride, ethylene/methyl acrylate/maleic anhydride, ethylene/ethyl acrylate/maleic anhydride, ethylene/methyl acrylate/lglycidyl methacrylate; grafted polyethylene; ethylene vinyl acetate, polyamide grafted and polyethylene.

12. The multi-layer film structure of claim 1, wherein said total film thickness is from 25 to less than 250 microns.

13. The multi-layer film structure of claim 1, wherein said film structure is selected from the group consisting of a PVDF-anhydride functional PMMA blend/polyamide/functional polyolefin; PVDF/PVDF-acid functional PMMA blend/functional polyolefin; PVDF/PVDF-acid functional PMMA blend/functional polyolefin/polyolefin.

14. The multi-layer film structure of claim 1, wherein one or more layers further comprises one or more additives, selected from the group consisting of impact modifiers, UV stabilizers, plasticizers, fillers, coloring agents, $TiO_2$, ZnO, antioxidants, antistatic agents, surfactants, toner, pigments, matting agents, adhesion promoters, and dispersing aids.

15. The multi-layer film structure of claim 1, wherein one or more of the weatherable layer and/or high thermal deformation layers comprises additives and/or pigment to make the multi-layer film opaque to UV light, wherein said film has an absorbance of greater than 1 at 360 nm.

16. The multi-layer film structure of claim 1, comprising a polyolefin layer d) having a thickness of from 200 to 750 microns.

17. The multilayer film structure of claim 16, wherein the polyolefin layer further comprises a woven or non-woven mesh or scrim.

18. The photovoltaic module of claim 17, wherein said multilayer film further comprises a layer of encapsulant material on the side of the film directly adjoining the polyamide or polyolefin layer.

* * * * *